(12) United States Patent
Manning et al.

(10) Patent No.: US 6,184,520 B1
(45) Date of Patent: Feb. 6, 2001

(54) INTERNAL DRUM IMAGING SYSTEM

(75) Inventors: Stephen R. Manning, North Andover, MA (US); Jeffrey M. Janway, Manchester; Libor Krupica, Nashua, both of NH (US)

(73) Assignee: Agfa Corporation, Wilmington, DE (US)

(*) Notice: Under 35 U.S.C. 154(b), the term of this patent shall be extended for 0 days.

(21) Appl. No.: 09/229,058

(22) Filed: Jan. 12, 1999

(51) Int. Cl.$^7$ .................................................. H01J 3/14
(52) U.S. Cl. ........................ 250/234; 250/235; 250/236; 369/177; 74/89
(58) Field of Search .................... 74/89; 476/11; 105/77; 369/177, 178; 250/234, 235, 236, 216

(56) References Cited

U.S. PATENT DOCUMENTS

| | | | |
|---|---|---|---|
| 4,250,763 | * 2/1981 | Dangschat | 74/208 |
| 5,598,739 | 2/1997 | Blake et al. | 74/89 |
| 6,081,316 | * 6/2000 | Okamura et al. | 355/18 |

* cited by examiner

Primary Examiner—Georgia Epps
Assistant Examiner—Tim Thompson
(74) Attorney, Agent, or Firm—John A. Merecki

(57) ABSTRACT

An imaging system including a one-piece aluminum internal drum casting having reduced weight and increased stiffness. The internal drum is mounted to the frame structure of the imaging system using a plurality of mounts positioned in a plane substantially along the center of gravity of the internal drum. The mounts reduce the amount of sway of the internal drum within the frame structure.

18 Claims, 6 Drawing Sheets

INTERNAL DRUM IMAGING SYSTEM

FIELD OF THE INVENTION

The present invention is in the field of imaging systems. More particularly, the present invention provides an imaging system including a one-piece internal drum casting having reduced weight and increased stiffness. In addition, the present invention provides an improved method and apparatus for mounting an internal drum to a frame structure.

BACKGROUND OF THE INVENTION

In many imaging systems, such as imagesetters or platesetters, a movable optical carriage is used to displace a laser system or other imaging source in a slow scan direction along an internal drum to expose a supply of recording media supported on the drum. Generally, the imaging source includes a beam deflection assembly, comprising a deflector element (e.g., a mirror) and a spin motor for rotating the deflector element, for deflecting an imaging beam generated by a radiation source across the recording media. Such an imaging system is described, for example, in U.S. Pat. No. 5,598,739, assigned to the Agfa Division, Bayer Corporation, incorporated herein by reference.

Currently available internal drum imaging systems, such as the imaging system disclosed in U.S. Pat. No. 5,598,739, commonly utilize a two-piece internal drum comprising a base portion and an upper structure. The base portion is in the form of a partial cylinder and includes a machined imaging surface for supporting and positioning a supply of recording media during imaging. The upper structure is mounted on the base portion and includes a rail system for supporting and guiding a movable optical carriage along the length of the internal drum.

The base portion and the upper structure of the internal drum are separately cast from a lightweight material such as an aluminum alloy, and are separately machined and finished according to design requirements. Since the base portion and the upper structure comprise separate components, means for attaching the upper structure to the base portion under exacting tolerances must be provided. Thus, the separate manufacture and subsequent attachment of the upper structure to the base portion greatly impacts the expense and time required to produce and assemble a two-piece internal drum.

The imaging engine (i.e., the internal drum, optical carriage, electronics, cabling, etc.) of an internal drum imaging system is typically mounted on a frame structure using a plurality of vibration isolating mounts. The vibration isolating mounts, which are commonly located under the internal drum, support and isolate the imaging engine against shock and vibration from external sources during the operation, transportation, and storage of the imaging system. Although the vibration isolating mounts effectively isolate the imaging engine against most external sources, damage to the outer covers or "skins" of the imaging system, to the imaging engine itself, or to other components of the imaging system, often occurs due to excessive sway of the imaging engine within the frame structure. Such excessive sway of the imaging engine may occur, for example, in response to a large sudden jolt to the imaging system during shipping.

SUMMARY OF THE INVENTION

The present invention provides an internal drum imaging system including a one-piece internal drum casting having reduced weight, increased stiffness, and reduced manufacturing cost. In addition, the present invention provides an improved method and apparatus for mounting an internal drum to a frame structure to substantially reduce any sway of the internal drum within or relative to the frame structure during the operation, transportation, and storage of the imaging system.

The internal drum of the present invention is cast as a single unit from an aluminum alloy or other suitable, lightweight material. By using a set of strategically positioned and geometrically optimized ribs, supports, and other structures, the amount of material used in the fabrication of the casting is minimized while maintaining or increasing the stiffness, strength, and structural integrity of the internal drum.

In accordance with the present invention, the internal drum is mounted to the frame structure of the imaging system using a plurality of mounts positioned in a plane substantially along the center of gravity of the internal drum. By locating the mounts in this manner, the amount of sway of the internal drum within or relative to the frame structure is substantially reduced. Advantageously, this reduces any damage caused by movement of the internal drum within the imaging system. Further, because less sway must be accommodated in the design of the imaging system, the overall dimensions of the imaging system, as well as manufacturing and packaging costs, are also reduced.

BRIEF DESCRIPTION OF THE DRAWINGS

The features of the present invention will best be understood from a detailed description of the invention and a preferred embodiment thereof selected for the purposes of illustration and shown in the accompanying drawings in which.

DETAILED DESCRIPTION OF THE INVENTION

Figure 1:
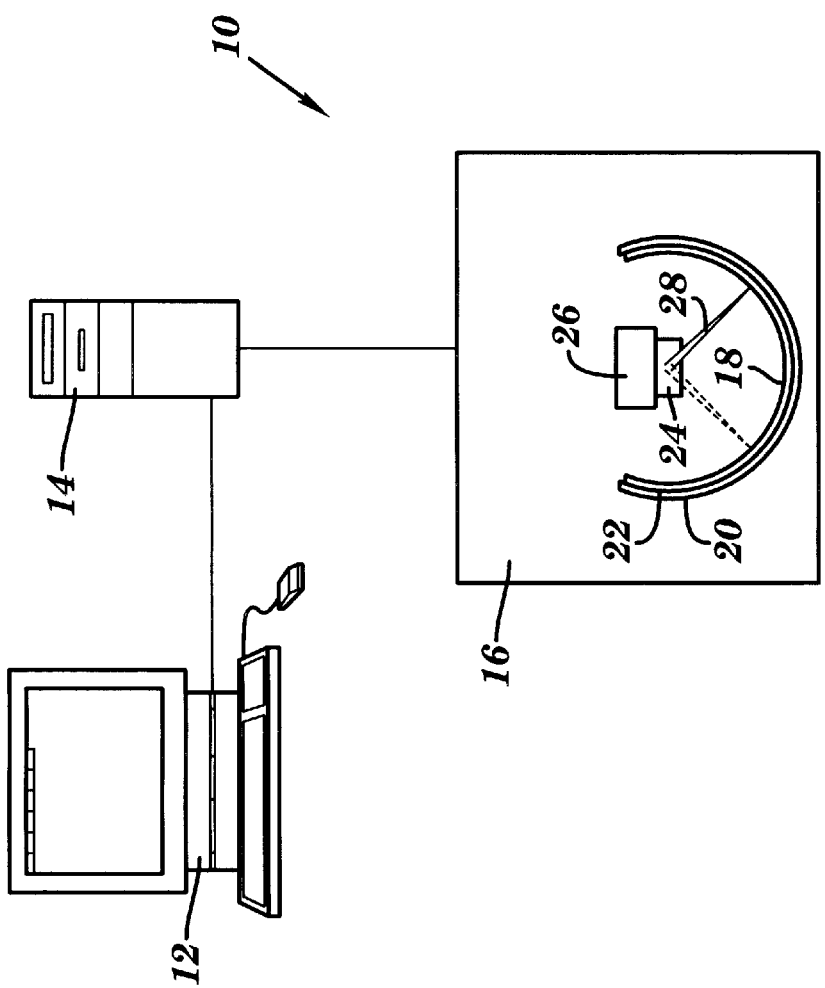
FIG. 1 illustrates an example of an imaging system.

The features and advantages of the present invention are illustrated in detail in the accompanying drawings, wherein like reference numerals refer to like elements throughout the drawings. Although the drawings are intended to aid in understanding the present invention, they are not necessarily drawn to scale.

An example of an internal drum imaging system 10 is illustrated in FIG. 1. In this example, the imaging system 10 comprises an imagesetter configured to image digital data onto a supply of film, plates, or other recording media. Although described below with regard to an imagesetter, the present invention may be used in conjunction with a wide variety of other types of internal drum imaging systems, including platesetters and the like, without departing from the intended scope of the present invention as set forth in the claims.

The imaging system 10 generally includes a front end computer or workstation 12 for the design and layout of pages to be printed, a raster image processor (RIP) 14 for rasterizing the page data, and an imagesetter 16. The imagesetter 16 records the digital data provided by the RIP 14 onto a supply of photosensitive, radiation sensitive, thermally sensitive, or other type of suitable recording media 18.

The imagesetter 16 includes an internal drum 20 having a cylindrical imaging surface 22 for supporting and positioning the recording media 18 during imaging. The imagesetter 16 further includes a scanning system 24, carried along a rail system 27 by a movable optical carriage 26, for recording digital data onto the recording media 18 using an imaging beam 28.

Figure 2:
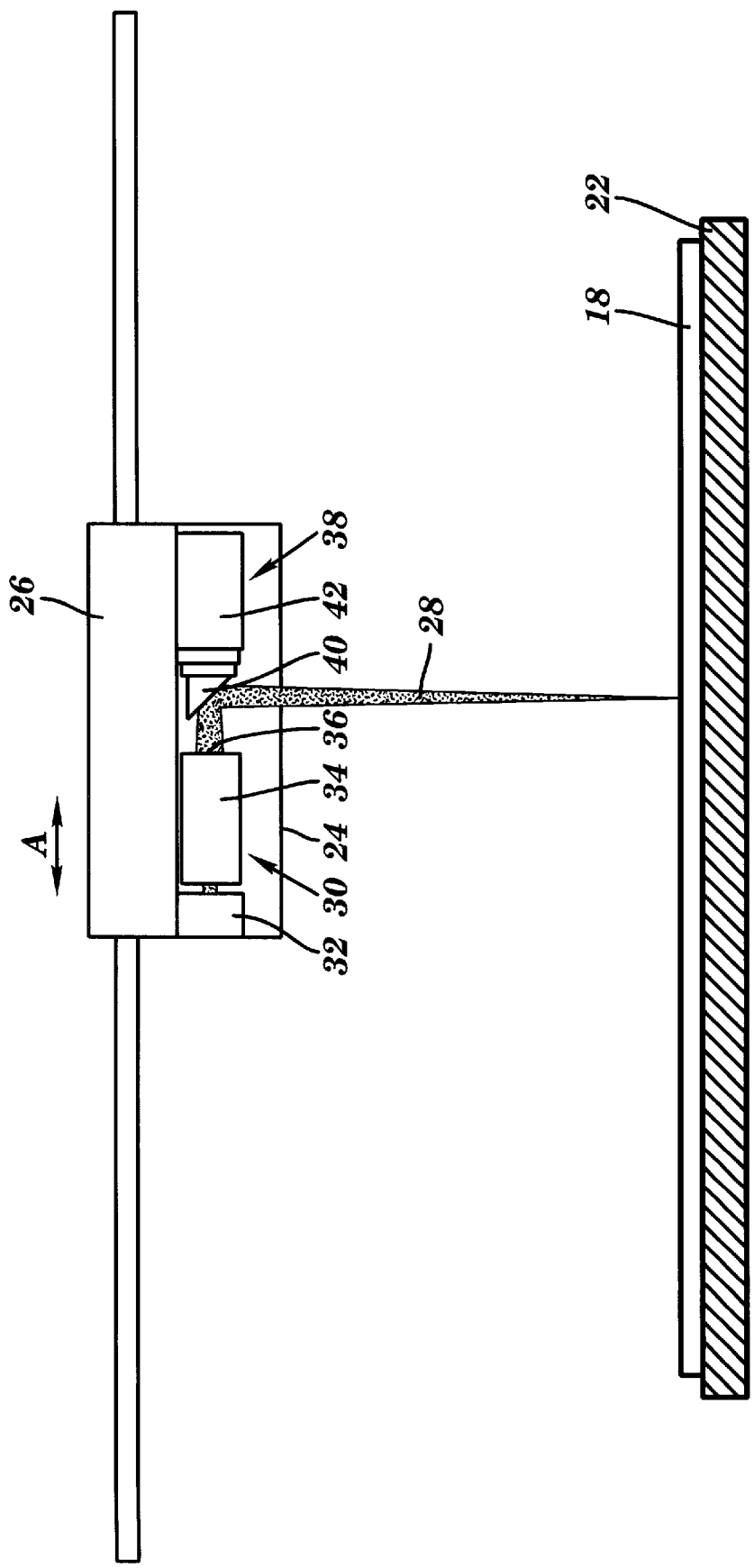
FIG. 2 illustrates the movable optical carriage and scanning system of the imaging system of FIG. 1.

As illustrated in FIG. 2, the scanning system 24 is displaced by the movable optical carriage 26 in a slow scan direction (directional arrow A) along the internal drum 20 to expose the recording media 18 in a line-by-line manner. The optical carriage 26 is preferably displaced by an onboard drive system (not shown), although an external drive system may also be used.

The scanning system 24 typically includes a laser system 30 for generating the imaging beam 28. The laser system 30 comprises a light or radiation source 32 for producing the imaging beam 28, and an optical system 34 positioned between the radiation source 32 and the imaging surface 22 for focusing the imaging beam 28 onto the recording media 18. The imaging beam 28 exits the optical system 34 through a spot focusing lens 36. The scanning system 24 further includes a beam deflection assembly 38 for deflecting the imaging beam 28 across the recording media 18 in a radial fast scan direction (see FIG. 1) to record a scan line on the recording media 18. The beam deflection assembly 38 comprises a deflector element 40 (e.g., a mirror) and a spin motor 42 for rotating the deflector element 40. As the deflector element 40 is rotated by the spin motor 42, the imaging beam 28 is scanned across the recording media 18 as shown in FIG. 1, thereby imaging a scan line on the recording media 18.

Figure 3:
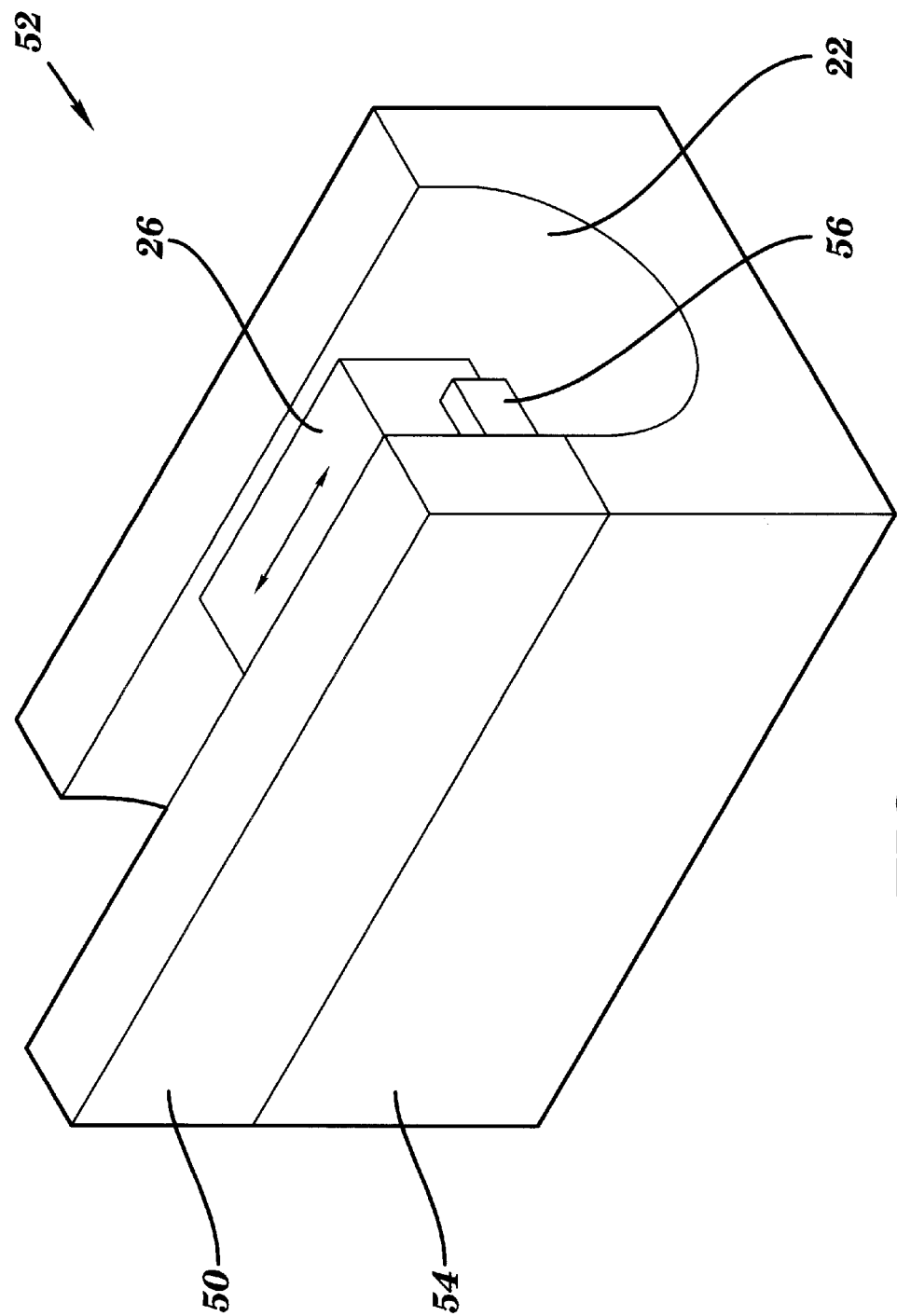
FIG. 3 is a general perspective view of a movable optical carriage supported on the upper structure of a two-piece internal drum.

Referring to FIG. 3, there is illustrated a general perspective view of the movable optical carriage 26 supported on an upper structure 50 of a two-piece internal drum 52. The upper structure 50 is mounted to a base portion 54, and includes a rail system 56 for movably supporting and guiding the movable optical carriage 26 and attached scanning system (not shown) along the length of the internal drum 52. The base portion 54 includes a cylindrical imaging surface 22 for supporting and positioning a supply of recording media during imaging.

Figure 4:
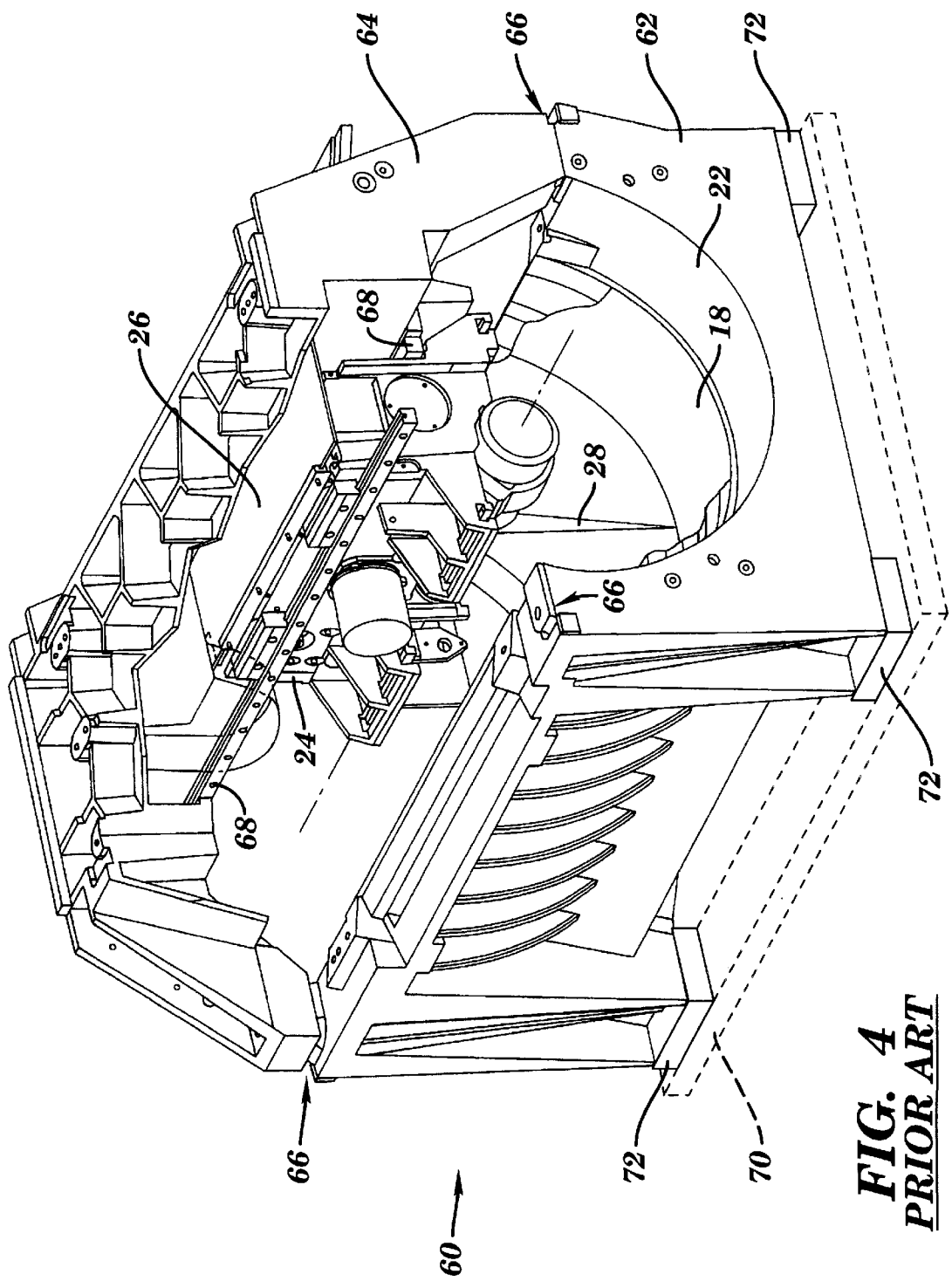
FIG. 4 is a partial, detail perspective view of a movable optical carriage supported on the upper structure of a two-piece internal drum.

A more detailed view of a two-piece internal drum 60 is illustrated in FIG. 4. The internal drum 60 is disclosed, for example, in U.S. Pat. No. 5,598,739. The internal drum 60 includes a base portion 62 and an upper structure 64. A mounting system 66 is used to mount the upper structure 64 onto the base portion 62. A rail system 68 is provided to support and guide the movable optical carriage 26 and attached scanning system 24 along the length of the internal drum 60. The base portion 62 includes a cylindrical imaging surface 22 for supporting and positioning a supply of recording media 18 during imaging.

The base portion 62 of the internal drum 60 is mounted to a frame structure 70 using a plurality of vibration isolating mounts 72. The vibration isolating mounts 72 support and isolate the internal drum 60 against shock and vibration from external sources during the operation, transportation, and storage of the imaging system. The frame structure 70 typically includes a plurality of vertical and horizontal frame members to which various interior and exterior components (e.g., skins, access doors, etc.) of the imaging system are attached. However, for clarity, only a portion of the frame structure 70 is illustrated in phantom in FIG. 4.

The internal drum 60 is mounted to the frame structure 70 by the plurality of vibration isolating mounts 72 at locations well below the center of gravity of the internal drum 60. Unfortunately, by mounting the internal drum 60 to the frame structure 70 in this way, the internal drum 60 may sway excessively relative to the frame structure 70, potentially damaging components of the imaging system.

Figure 5:
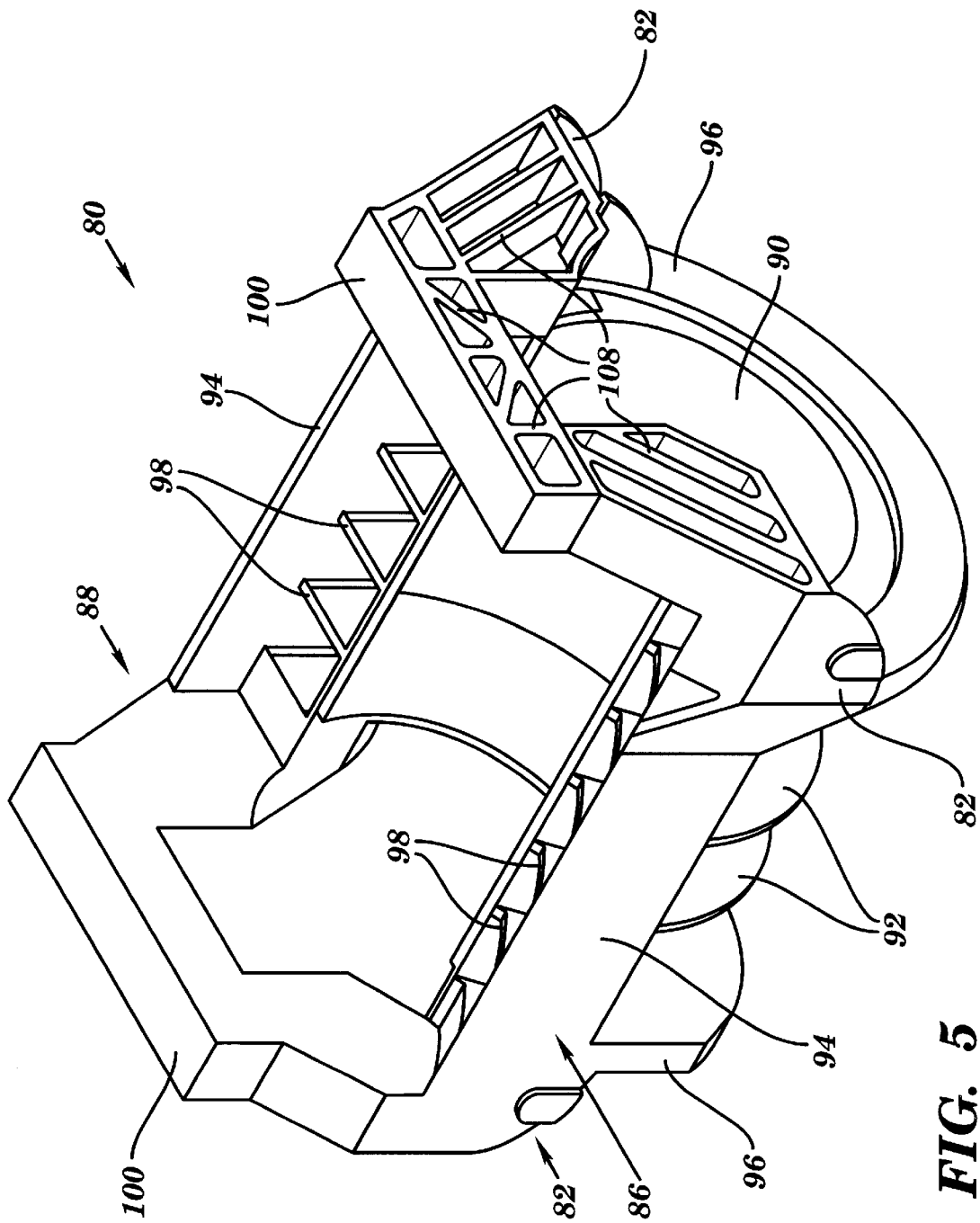
FIG. 5 illustrates a one-piece internal drum in accordance with a preferred embodiment of the present invention.

In accordance with the preferred embodiment of the present invention, and as illustrated in FIG. 5, there is provided a one-piece internal drum casting, hereinafter "internal drum" 80, having, inter alia, reduced weight, increased stiffness, and reduced manufacturing cost. The internal drum 80 is provided with a plurality of mounts 82 for mounting the internal drum 80 to a frame structure 84 (FIG. 6) in a manner that substantially reduces any sway of the internal drum 80 within or relative to the frame structure 84.

The internal drum 80 includes a base portion 86 and an upper structure 88 that are integrally formed in a single casting process from an aluminum alloy or other suitable material. This design provides several benefits over previously available two-piece internal drums (e.g., see FIG. 4). For example, by forming the internal drum 80 as a single unit, the amount of machining, finishing work, assembly time, etc., required to produce an internal drum ready for imaging, compared to that required for a two-piece internal drum, is greatly reduced. This reduces the manufacturing time and production cost of the internal drum 80. The one-piece design also increases the overall stiffness of the internal drum 80, thereby improving imaging quality.

In accordance with the present invention, the amount of material required to produce the internal drum 80 has been minimized wherever possible to reduce material costs and the weight of the internal drum 80. This is achieved using a unique design methodology wherein a set of strategically positioned and geometrically optimized ribs, supports, and other structures are used in lieu of the more solid and heavy portions of previously available internal drums. The amount of material required to produce the internal drum 80, and the weight of the internal drum 80, have also been substantially reduced by mounting the internal drum 80 to the frame structure 84 of the imaging system using a plurality of mounts 82 positioned in a plane substantially along the center of gravity of the internal drum 80.

As illustrated in FIG. 5, the base portion 86 of the internal drum 80 generally has a cylindrical configuration, and includes a cylindrical imaging surface 90 for supporting and positioning a supply of recording media during imaging. A plurality of ribs 92 are used to support, strengthen, and stiffen the imaging surface 90. The ribs 92 preferably encircle the entire underside of the imaging surface 90, and have a curvature corresponding to the curvature of the imaging surface 90.

To reduce the amount of material required to produce the ribs 92, and the corresponding weight of the ribs 92, the thickness of each rib 92 is minimized as much as possible. Additionally, the ribs 92 preferably taper away from the imaging surface 90 to further reduce material requirements and weight.

The base portion 86 of the internal drum 80 further includes opposing longitudinal members 94 that extend longitudinally along the internal drum 80 between a pair of end supports 96. The imaging surface 90 extends between the pair of end supports 96, and is connected to the longitudinal members 94 by a plurality of supports 98, thereby forming a lightweight, strong, honeycomb-type structure.

Figure 6:
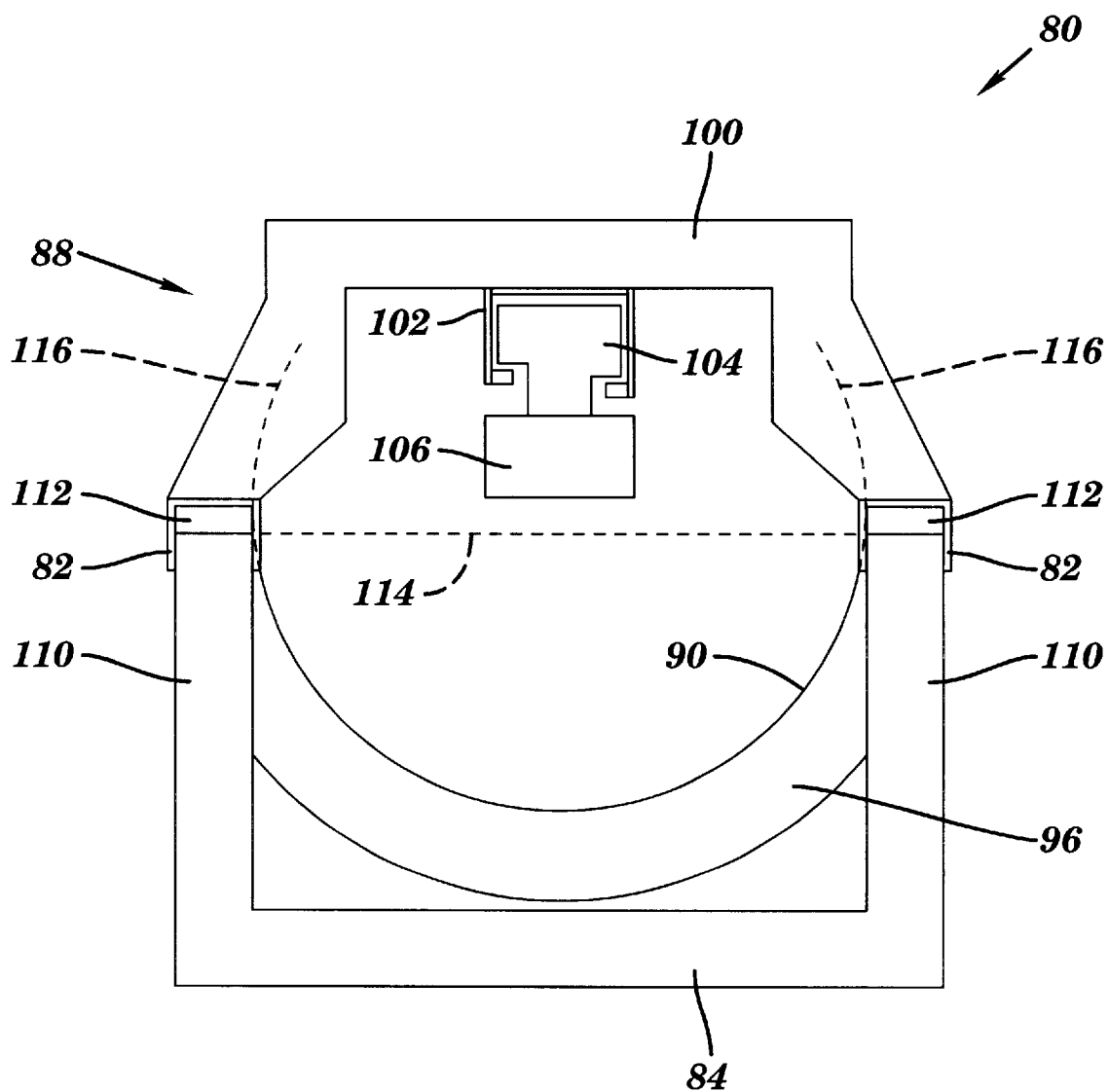
FIG. 6 is an end view of an internal drum of the present invention mounted on a frame structure of an imaging system.

The upper structure 88 of the internal drum 80 includes a pair of cross members 100. As illustrated in FIG. 6, the cross members 100 support a rail system 102. The rail system 102 is used to support and guide a movable optical carriage 104 and attached scanning system 106 along the length of the internal drum 80. The material requirements and weight of the cross members 100 are minimized, while maintaining the strength of the cross members 100, by forming the cross members 100 using a plurality of vertical and angled support/brace members 108, again forming a lightweight, strong, honeycomb-type structure.

As illustrated in FIG. 6, a plurality of legs 110 of the frame assembly 84 are received within the mounts 82. A vibration isolator 112 is positioned between each leg 110 of the frame assembly 84 and a corresponding one of the mounts 82. The vibration isolators 112 support and isolate the internal drum 80 against shock and vibration from external sources during the operation, transportation, and storage of the imaging system. Preferably, the mounts 82 are positioned in a horizontal plane 114 substantially along the center of gravity of the internal drum 80 to minimize the sway of the internal drum 80 within or relative to the frame structure.

Comparing FIG. 4 with FIGS. 5 and 6, it should be readily apparent that the base portion 86 of the internal drum 80 requires much less material than the base portion 62 of the internal drum 60. The reduction in material, which results in a corresponding reduction in the weight of the internal drum 80, is provided, in part, by positioning the mounts 82 in a plane 114 substantially along the center of gravity of the internal drum 80. By positioning the mounts 82 in this manner, the large, heavy base portion 62 of the internal drum 60 is no longer necessary.

A further advantage of the one-piece internal drum 80 of the present invention should be readily apparent from a comparison of FIGS. 4 and 6. Specifically, referring first to FIG. 4, a two-piece internal drum 60 requires the use of a mounting system 66 to mount the upper structure 64 onto the base portion 62. Unfortunately, this limits the surface area of the cylindrical imaging surface 22 and the available wrap angle of the imaging beam 28 in the fast scan direction, thereby limiting the imaging speed of the imaging system. When using the one-piece internal drum 80 of the present invention, however, the cylindrical imaging surface 90 may have a substantially larger surface area as indicated in phantom (reference number 116) in FIG. 6. Thus, a substantially larger wrap angle (e.g., 270 degrees) is available during imaging in the internal drum 80, thereby increasing the imaging speed of the imaging system.

The foregoing description of the present invention has been presented for purposes of illustration and description. It is not intended to be exhaustive or to limit the invention to the precise form disclosed, and many modifications and variations are possible in light of the above teaching. Such modifications and variations that may be apparent to a person skilled in the art are intended to be included within the scope of this invention as defined by the accompanying claims.

What is claimed is:

1. An imaging system comprising:
    a one-piece internal drum casting including a base portion and an upper structure;
    a frame structure;
    a mounting system for mounting the internal drum casting to the frame structure;
    a cylindrical imaging surface formed on the base portion of the internal drum casting;
    a rail system coupled to the upper structure of the internal drum casting;
    a movable optical carriage supported and guided by the rail system; and
    a scanning system on the movable optical carriage for recording imaging data onto a supply of recording media positioned on the imaging surface.

2. The imaging system according to claim 1, wherein the scanning system further comprises:
    a laser system for generating an imaging beam; and
    a beam deflection assembly for deflecting the imaging beam across the supply of recording media to produce a scan line.

3. The imaging system according to claim 1, wherein the mounting system is positioned in a plane substantially along a center of gravity of the internal drum casting.

4. The imaging system according to claim 3, wherein the mounting system further includes:
    at least one mount; and
    a vibration isolator coupling each mount to the frame structure.

5. The imaging system according to claim 1, wherein the internal drum casting includes a plurality of mounts positioned in a plane substantially along a center of gravity of the internal drum casting.

6. The imaging system according to claim 1, wherein the base portion of the internal drum casting further includes a plurality of ribs, each of the ribs extending entirely across an underside of the imaging surface.

7. The imaging system according to claim 6, wherein each of the ribs is tapered.

8. An imaging apparatus, comprising:
    an internal drum including an imaging surface;
    a frame structure; and
    a mounting system, positioned in a plane substantially along a center of gravity of the internal drum, for mounting the internal drum to the frame structure.

9. The imaging apparatus according to claim 8, wherein the mounting system further includes:
    at least one mount; and
    a vibration isolator coupling each mount to the frame structure.

10. A method for manufacturing an internal drum imaging system, comprising the steps of:
    producing a one-piece internal drum, having a base portion and an upper structure, using a single casting;
    forming an imaging surface on the base portion of the internal drum; and
    mounting a movable optical carriage to the upper structure of the internal drum.

11. The method according to claim 10, further including the step of:
    minimizing the weight of the internal drum by forming the base portion and the upper structure of the internal drum using a honeycomb-type structure.

12. The method according to claim 10, further including the step of:
    forming a plurality of ribs on the base portion of the internal drum, each of the ribs extending entirely across an underside of the imaging surface.

13. The method according to claim 12, further including the step of:

tapering each of the ribs.

14. The method according to claim 10, further including the step of:

mounting the internal drum to a frame structure.

15. The method according to claim 14, wherein the step of mounting the internal drum to a frame structure further includes the step of:

providing the internal drum with at least one mount, wherein each mount is positioned in a plane substantially along a center of gravity of the internal drum.

16. The method according to claim 14, wherein the step of mounting the internal drum to a frame structure further includes the steps of:

providing the internal drum with at least one mount ; and reducing swaying of the internal drum relative to the frame structure by positioning each mount in a plane substantially along a center of gravity of the internal drum.

17. In an imaging system, a method for mounting an internal drum to a frame structure, comprising the steps of:

providing the internal drum with a plurality of mounts, wherein each mount is positioned in a plane substantially along a center of gravity of the internal drum; and mounting the internal drum to the frame structure using the mounts.

18. An imaging system comprising:

an internal drum including a base portion and an upper structure;

a cylindrical imaging surface formed on the base portion of the internal drum;

a rail system coupled to the upper structure of the internal drum;

a movable optical carriage supported and guided by the rail system;

a scanning system on the movable optical carriage for recording imaging data onto a supply of recording media positioned on the imaging surface; and a plurality of mounts positioned in a plane substantially along a center of gravity of the internal drum for mounting the internal drum to a frame.

* * * * *